(12) United States Patent
Nakajima et al.

(10) Patent No.: US 6,825,499 B2
(45) Date of Patent: Nov. 30, 2004

(54) DISPLAY SYSTEM AND METHOD OF PRODUCING THE SAME

(75) Inventors: Hideharu Nakajima, Kanagawa (JP); Masato Doi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/071,909

(22) Filed: Feb. 7, 2002

(65) Prior Publication Data

US 2002/0104999 A1 Aug. 8, 2002

(30) Foreign Application Priority Data

Feb. 8, 2001 (JP) .................................... P2001-032688

(51) Int. Cl.⁷ .............................................. H01L 33/00
(52) U.S. Cl. ....................................... 257/95; 257/103
(58) Field of Search ..................... 257/95, 88; 313/500; 148/33; 39/25.01; 438/58; 372/44

(56) References Cited

U.S. PATENT DOCUMENTS 5,701,321 A * 12/1997 Hayafuji et al. ............ 372/44
6,320,209 B1 * 11/2001 Hata et al. ................. 257/190
6,410,942 B1 * 6/2002 Thibeault et al. ........... 257/88

FOREIGN PATENT DOCUMENTS

| JP | 7-094124 | 4/1995 |
| JP | 7-142579 | 6/1995 |

* cited by examiner

*Primary Examiner*—Douglas Wille
(74) *Attorney, Agent, or Firm*—Bell, Boyd & Lloyd LLC

(57) ABSTRACT

Disclosed are a display system and a method of producing the same. In the present invention, a hexagonal pyramid shaped GaN semiconductor light-emitting device selectively crystal-grown is fixed on an upper surface of a substrate by embedding it in an insulation layer formed of an epoxy resin. Then the insulation layer is selectively dry etched in an oxygen plasma atmosphere to expose an upper end portion of the GaN semiconductor light-emitting device. A conductor film is formed on the entire surface, and a required portion of the conductor film is left as a lead-out electrode while the unrequired portion is removed by lithography.

15 Claims, 12 Drawing Sheets

DISPLAY SYSTEM AND METHOD OF PRODUCING THE SAME

BACKGROUND OF THE INVENTION

The present invention relates to a display system and a method of producing the same, and particularly to a display system in which an insulation layer with semiconductor light-emitting devices as light sources embedded therein is thinned and a conductor film is provided on upper end portions of the semiconductor light-emitting devices exposed by the thinning, whereby upper end portion electrodes are led out, and a method of producing the same.

As a method of leading out an electrode of a semiconductor device covered with an insulation layer to the exterior, a method of forming a contact hole in the insulation layer by lithography, embedding a conductor material in the contact hole by, for example, a sputtering method and forming a conductor film on the surface of the insulation layer is widely conducted.

FIG. 17 shows a process of leading out an electrode 51 in a semiconductor device 50. FIG. 17A is a sectional view showing a silicon substrate 52 provided with the electrode 51 and a $SiO_2$ insulation layer 53 provided on the surface thereof. In order to lead out the electrode 51 to the upper side of the insulation layer 53, a contact hole 54 is formed at the location where the electrode 51 is present, as shown in FIG. 17B. At this time, a positional deviation may occur between the contact hole 54 and the electrode 51. Furthermore, the probability of a positional deviation is greater as the electrode 51 is made smaller.

In order to fill the contact hole 54 with a conductor metal and provide a lead-out electrode on the upper surface of the insulation layer 53, sputtering or vapor deposition of a conductor metal 55 such as aluminum is carried out. However, the straight flying characteristics of the conductor metal particles, the conductor metal 55 tends to be deposited on a bottom portion of the contact hole 54, but not on the side wall, because the side wall is hidden by the conductor metal 55 which is deposited and grown on the inner peripheral portion of the top opening of the contact hole 54, as shown in FIG. 17C. As the process proceeds, connection failure may occur at the side wall portion of the contact hole 54. Alternatively, there may be difficulty in closing the opening at the top of the contact hole while leaving cavity on the inside of the contact hole 54, as shown in FIG. 17D.

In order to facilitate the connection described above, a method is known in the prior art in which the insulation layer is etched back. Namely, in Japanese Patent Laid-open No. Hei 7-142579, a contact wiring is adopted in place of the contact hole. FIG. 18 shows a process of connecting a lower layer wiring and an upper layer wiring by a contact wiring in the case of producing an image display system including surface conduction type electron emitting devices (SCE) as elements. As shown in FIG. 18A, a metal is electron beam vapor deposited on the lower layer wiring 62 provided on an insulating substrate 61, and unrequired portions are lifted up to form the contact wiring 63. Subsequently, as shown in FIG. 18B, an insulation film 64 of silicon oxide or the like is formed over the entire surface by a sputtering method. Further, as shown in FIG. 18C, a photoresist 65 is formed over the entire surface. Thereafter, as shown in FIG. 18D, etching back for flattening is conducted to expose the surface of the contact wiring 63, and, as shown in FIG. 18E, an upper layer wiring 66 is provided. Thus, a multilayer wiring is disclosed. However, this method exposes the contact wiring, not the semiconductor light-emitting devices.

Japanese Patent Laid-open No. Hei 7-94124 discloses a method of producing light-emitting devices in a display system including electric field emission cathodes. As shown in FIG. 19A, a cathode chip 70a is provided on a main surface of a substrate 70, and, as shown in FIG. 19B, an insulation layer 72 and an anode layer 73 are sequentially provided on the substrate 70 by sputtering. Further, as shown in FIG. 19C, a fluorescent material layer 74 is provided by sputtering. Then, as shown in FIG. 19D, a polyimide resin layer 75 is deposited to cause flattening, and thereafter, the polyimide resin layer 75 is etched back to expose a protuberant portion of the fluorescent material layer 74, leaving the polyimide resin layer 75 therearound. Then, as shown in FIG. 19E, the fluorescent material layer 74, the anode layer 73 and the insulation layer 72 are sequentially selectively etched using the polyimide resin layer 75 as a mask, whereby the cathode chip 70a is exposed. However, this method has the exposure of the cathode chip itself as an object, and is not for leading out the upper end portion electrode of the semiconductor light-emitting device exposed.

SUMMARY OF THE INVENTION

The present invention has been made in consideration of the above described limitations of the prior art. Accordingly, it is an object of the present invention to provide a display system including semiconductor light-emitting devices disposed on and fitted to a substrate surface and covered with an insulation layer, in which upper end portion electrodes of the semiconductor light-emitting devices are led out easily and securely. The invention further includes a method of producing the same.

The above-mentioned problems can be solved by a first aspect or a second aspect of the present invention. The inventive solutions will be described below.

In accordance with a first aspect of the present invention, there is provided a display system including multiple semiconductor light-emitting devices disposed on and fitted to a substrate surface. An insulation layer with the semiconductor light-emitting devices embedded therein is thinned selectively or non-selectively. Further, a conductor film is provided on upper end portions of the semiconductor light-emitting devices which are exposed by the thinning, and upper end portion electrodes of the semiconductor light-emitting devices are led out to an upper surface of the insulation layer. Unlike display systems in which a contact hole for leading out the upper end portion electrode onto the insulation layer is not provided, the display system of the present invention is free of the positional deviation problems between the contact hole and the upper end portion electrode and contact failure in the contact hole. Thus, the upper end portion electrodes of the semiconductor light-emitting devices are connected easily and securely.

Preferably, there is provided a display system in which the insulation layer is formed of a high polymeric compound capable of forming a coating film containing a polyimide resin, an epoxy resin or a synthetic rubber or a glass capable of forming a coating film. In such a display system, the insulation layer is formed by application, so that the insulation layer can be easily formed even in the case where the area of the substrate surface is large, and the display system is reduced in cost.

Preferably, there is provided a display system in which the insulation layer is composed of silicon oxide or silicon nitride formed by a CVD (chemical vapor deposition) method or a sputtering method. Such a display system shows excellent heat resistance owing to the insulation layer composed of the inorganic material.

Preferably, there is provided a display system in which the thinning of the insulation layer is carried out by a dry etching method under an oxygen plasma atmosphere, a chemical mechanical polishing method or a combination of both methods. In such a display system, a most appropriate method is selected according to the kind of material of the insulation layer adopted and the conditions of the thinning.

Preferably, there is provided a display system in which the semiconductor light-emitting device has a primary light-emitting direction in a direction from a light-emitting region toward a lower end surface on the substrate surface, and has a reflective surface for downward reflection at a portion above the light-emitting region. In such a display system, the light emitted from the semiconductor light-emitting device is effectively directed in the light-emitting direction toward the lower end surface by the reflective surface.

Preferably, there is provided a display system in which the semiconductor light-emitting device is formed in a pyramid shape or a truncated pyramid shape, and at least one slant surface of surfaces thereof is the reflective surface. In such a display system, a slant surface of the pyramid or truncated pyramid and an upper surface also in the case of the truncated pyramid, are reflective surfaces, so that the light emitted can be concentrated to the lower end surface side.

Preferably, there is provided a display system in which the semiconductor light-emitting device is composed of a hexagonal crystal of a gallium nitride semiconductor, and includes at least an active layer, namely a light-emitting region, parallel to (1,-1,0,1) plane. In such a display system, the active layer parallel to (0,0,0,1) plane of the gallium nitride semiconductor has a high light-emitting efficiency, and an electrode surface provided on (1,-1,0,1) plane can be made to be a reflective surface, so that excellent light-emitting performance is obtained.

Preferably, there is provided a display system in which the semiconductor light-emitting device is composed of a gallium nitride semiconductor selectively grown in a hexagonal pyramid shape or a truncated hexagonal pyramid shape with (0,0,0,1) plane as the lower end surface and with (1,-1,0,1) plane and an equivalent surface as the slant surface, on a substrate surface of growth, and includes an active layer parallel to (1,-1,0,1) plane and an equivalent surface. In such a display system, the active layer parallel to (1,-1,0,1) plane of the gallium nitride semiconductor has a high light-emitting efficiency, and an electrode surface provided on (1,-1,0,1) plane can be made to be a reflective surface, so that the light emitted is concentrated to the lower end surface side, and a display system with high luminance is provided.

Preferably, there is provided a display system in which the display system is an image display system or an illumination system including the semiconductor light-emitting devices which emit monochromic light or a combination of a plurality of kinds of semiconductor light-emitting devices which emit different-colored lights. Such a display system provides a clear or a clear and colorful image or illumination.

Preferably, there is provided a display system in which the semiconductor light-emitting devices each include a first conduction type semiconductor layer, an active layer and a second conduction type semiconductor layer sequentially laminated, the upper end portion electrode is formed at the second conduction type semiconductor layer, and the upper end portion electrode and the conductor film are formed of the same kind of metal. In such a display system, a lead-out electrode composed of the conductor film and the upper end portion electrode are jointed rigidly and stably.

Preferably, there is provided a display system in which the semiconductor light-emitting devices each include a first conduction type semiconductor layer, an active layer and a second conduction type semiconductor layer sequentially laminated, the insulation layer is thinned, and the conductor film is formed on a surface formed of the second conduction type semiconductor layer exposed by the thinning and the insulation layer, whereby the upper end portion electrode and the conductor film are formed as one body with each other. In such a display system, fitting of the upper end portion electrode to the second conduction type semiconductor layer and formation of the conductor film are carried out simultaneously, so that the number of steps is reduced, and cost is thereby reduced.

Preferably, there is provided a display system in which the semiconductor light-emitting devices each include a first conduction type semiconductor layer, an active layer and a second conduction type semiconductor layer sequentially laminated, the upper end portion electrode is provided on the second conduction type semiconductor layer with a contact metal layer of a predetermined thickness therebetween, and the upper end portion electrode and the conductor film are formed of the same kind of metal. In such a display system, a lead-out electrode composed of the conductor film and the upper end portion electrode are jointed rigidly and stably, the reflectance of the upper end portion electrode is high, and the reflected light is concentrated into an emitted light pick-up direction, so that light-emitting efficiency is high.

Preferably, there is provided a display system in which the semiconductor light-emitting devices each include a first conduction type semiconductor layer, an active layer and a second conduction type semiconductor layer sequentially laminated, a contact metal layer of a predetermined thickness is formed on the second conduction type semiconductor layer, the insulation layer is thinned, and the conductor film is formed on a surface formed of the contact metal layer exposed by the thinning and the insulation layer, whereby the upper end portion electrode and the conductor film are formed as one body with each other. In such a display system, the reflectance of the upper end portion electrode is high, the reflected light is concentrated into an emitted light pick-up direction, light-emitting efficiency is therefore high, and, further, the upper end portion electrode and the conductor film are formed as one body with each other, so that the number of steps is reduced, and production cost is lowered.

In accordance with a second aspect of the invention, there is provided a method of producing a display system by disposing and fitting multiple of semiconductor light-emitting devices to a substrate surface, including the steps of embedding the semiconductor light-emitting devices in an insulation layer, selectively or non-selectively thinning the insulation layer to expose upper end portions of the semiconductor light-emitting devices, and forming a conductor film on the exposed upper end portions, whereby upper end portion electrodes of the semiconductor light-emitting devices are led out to an upper surface of the insulation layer. According to such a method of producing a display system, a contact hole is not provided in the insulation layer covering the semiconductor light-emitting devices, so that the troubles of positional deviation between the contact hole and the upper end portion electrode of the semiconductor light-emitting device and contact failure in the contact hole are absent, and the upper end portion electrodes of the semiconductor light-emitting devices can be lead out to the upper surface of the insulation layer easily and securely.

Preferably, there is provided a method of producing a display system in which the insulation layer is formed by application of a high polymeric compound capable of forming a coating film containing an epoxy resin, a polyimide resin or a synthetic rubber or a glass capable of forming a coating film. According to such a method of producing a display system, the insulation layer can be easily formed even where the area of the substrate surface is large.

Preferably, there is provided a method of producing a display system in which the insulation layer is formed by building up silicon oxide or silicon nitride by a CVD method or a sputtering method. Such a method of producing a display system gives a display system high in heat resistance temperature owing to the insulation layer formed of the inorganic material.

Preferably, there is provided a method of producing a display system in which the insulation layer is thinned by a dry etching method under an oxygen plasma atmosphere, a chemical mechanical polishing method or a combination of both methods. According to such a method of producing a display system, a most appropriate method can be adopted according to the kind of material of the insulation layer and the conditions of the thinning.

Preferably, there is provided a method of producing a display system in which semiconductor light-emitting devices each having a primary light-emitting direction in the direction from a light-emitting region toward a lower end surface on the substrate surface and including a reflective surface for downward reflection at a portion above the light-emitting region are used as the semiconductor light-emitting devices. According to such a method of producing a display system, the emitted light is effectively directed toward the lower end surface by the reflective surface of the semiconductor light-emitting device, thereby enhancing the luminance of the display system.

Preferably, there is provided a method of producing a display system in which semiconductor light-emitting devices which are formed in a pyramid shape or a truncated pyramid shape and in each of which at least one slant surface of surfaces thereof is the reflective surface are used as the semiconductor light-emitting devices. According to such a method of producing a display system, a slant surface of the polygonal pyramid or truncated polygonal pyramid, and the upper surface also in the case of the truncated polygonal pyramid, are reflective surfaces, whereby the light emitted by the semiconductor light-emitting device can be concentrated to the lower end surface side.

Preferably, there is provided a method of producing a display system in which semiconductor light-emitting devices each composed of a hexagonal crystal of a gallium nitride semiconductor and having an active layer parallel to (1,−1,0,1) plane are used as the semiconductor light-emitting devices. According to such a method of producing a display system, the active layer parallel to (1,−1,0,1) plane of the gallium nitride semiconductor light-emitting device shows a high light-emitting efficiency, so that a display system with excellent light-emitting performance is provided.

Preferably, there is provided a method of producing a display system in which semiconductor light-emitting devices each composed of a gallium nitride semiconductor selectively crystal-grown in a hexagonal pyramid shape or a truncated hexagonal pyramid shape with (0,0,0,1) plane as the lower end surface and with (1,−1,0,1) plane and equivalent surfaces as the slant surfaces, on a substrate surface of growth, and including active layers parallel to (1,−1,0,1) plane and equivalent surfaces are used as the semiconductor light-emitting devices. According to such a method of producing a display system, the active layer shows a high light-emitting efficiency, and an electrode surface provided on (1,−1,0,1) plane functions as a reflective surface to concentrate the emitted light to the lower end surface side, so that a display system with a particularly high luminance is provided.

Preferably, there is provided a method of producing a display system in which the semiconductor light-emitting devices each including a first conduction type semiconductor layer, an active layer and a second conduction type semiconductor layer sequentially laminated, and each including an upper end portion electrode formed at the second conduction type semiconductor layer are used as the semiconductor light-emitting devices, and the conductor film is formed of the same kind of metal as the upper end portion electrode. According to such a method of producing a display system, a lead-out electrode composed of the conductor film and the upper end portion electrode are jointed rigidly and stably.

Preferably, there is provided a method of producing a display system in which the semiconductor light-emitting devices each including a first conduction type semiconductor layer, an active layer and a second conduction type semiconductor layer sequentially laminated are used as the semiconductor light-emitting devices, the insulation layer is thinned, and the conductor film is formed on a surface formed of the second conduction type semiconductor layer exposed by the thinning and the insulation layer, whereby the upper end portion electrode and the conductor film are formed as one body with each other. According to such a method of producing a display system, the upper end portion electrode and the conductor film are formed as one body with each other, and the fitting of the upper end portion electrode to the second conduction type semiconductor layer and the formation of the conductor film are carried out simultaneously, so that the number of steps is reduced, and a display system low in cost is provided.

Preferably, there is provided a method of producing a display system in which the semiconductor light-emitting devices each including a first conduction type semiconductor layer, an active layer and a second conduction type semiconductor layer sequentially laminated, and each including an upper end portion electrode formed on the second conduction type semiconductor layer with a contact metal layer of a predetermined thickness therebetween are used as the semiconductor light-emitting devices, and the conductor film is formed of the same kind of metal as the upper end portion electrode. According to such a method of producing a display system, the reflectance of the upper end portion electrode is high, the reflected light is concentrated into an emitted light pick-up direction, thereby enhancing the light-emitting efficiency, and a lead-out electrode formed of the conductor film and the upper end portion electrode are jointed rigidly and stably.

Preferably, there is provided a method of producing a display system in which the semiconductor light-emitting devices each including a first conduction type semiconductor layer, an active layer and a second conduction type semiconductor layer sequentially laminated and each including a contact metal layer of a predetermined thickness are used as the semiconductor light-emitting devices, and the conductor film is formed on a surface formed of the contact metal layer exposed by thinning of the insulation layer and the insulation layer itself, whereby the upper end portion electrode and the conductor film are formed as one body with each other. According to such a method of producing a display system, the reflectance of the upper end portion electrode is high, and the reflected light is concentrated into an emitted light pick-up direction, so that light-emitting efficiency of the display system is enhanced. Furthermore, the upper end portion electrode and the conductor film are formed as one body with each other, and the fitting of the upper end portion electrode to the second conduction type semiconductor layer and the formation of the conductor film are carried out simultaneously, so that the number of steps is reduced, and the cost of the display system is thereby lowered.

The above and other objects, features and advantages of the present invention will become apparent from the following description and appended claims, taken in conjunction with the accompanying drawings which show by way of example some preferred embodiments of the invention.

Additional features and advantages of the present invention are described in, and will be apparent from, the following Detailed Description of the Invention and the figures.

BRIEF DESCRIPTION OF THE FIGURES

FIGS. 5A and 5B show the details of a GaN semiconductor light-emitting device crystal-grown in a hexagonal pyramid shape, in which FIG. 5A is a vertical sectional view, and FIG. 5B is a plan view;

FIGS. 17A to 17D are a set of figures showing a process of providing a contact hole in an insulation layer in a semiconductor system to provide an inside electrode with a lead-out electrode, in which FIG. 17A shows the condition before processing, FIG. 17B shows the condition where the contact hole has been provided, FIG. 17C shows the condition where a sputtered conductor metal is deposited on a bottom surface of the contact hole but is difficultly deposited on the inner peripheral surface of the contact hole, and FIG. 17D shows the condition where an opening portion of the contact hole is almost closed and contact failure and cavity are generated;

FIGS. 18A to 18E are a set of figures showing a contact wiring in place of a contact hole in connecting a lower layer wiring and an upper layer wiring, in which FIG. 18A shows the condition where the contact wiring is electron beam vapor deposited on the lower layer wiring, FIG. 18B shows the condition where an insulation film is provided to cover the entire surface, FIG. 18C shows the condition where a photoresist is formed, FIG. 18D shows the condition where an upper end portion of the contact wiring is exposed by etching back, and FIG. 18E shows the condition where the upper layer wiring is provided; and FIGS. 19A to 19E are a set of figures showing a method of laying out a discharge cathode chip, a fluorescent material layer and an anode layer in close positions, in which FIG. 19A shows a cathode chip provided on a substrate, FIG. 19B shows the condition where an insulation layer and the anode layer are provided thereon, FIG. 19C shows the condition where the fluorescent material layer is further provided thereon, FIG. 19D shows the condition where a polyimide resin layer has been provided thereon and has been etched back to expose a protuberant portion of the fluorescent material layer, and FIG. 19E shows the condition where the fluorescent material layer, the anode layer and the insulation layer have been etched by using the polyimide resin layer around the exposed fluorescent material layer as a mask to expose the cathode chip.

DETAILED DESCRIPTION OF THE INVENTION

Figure 1:
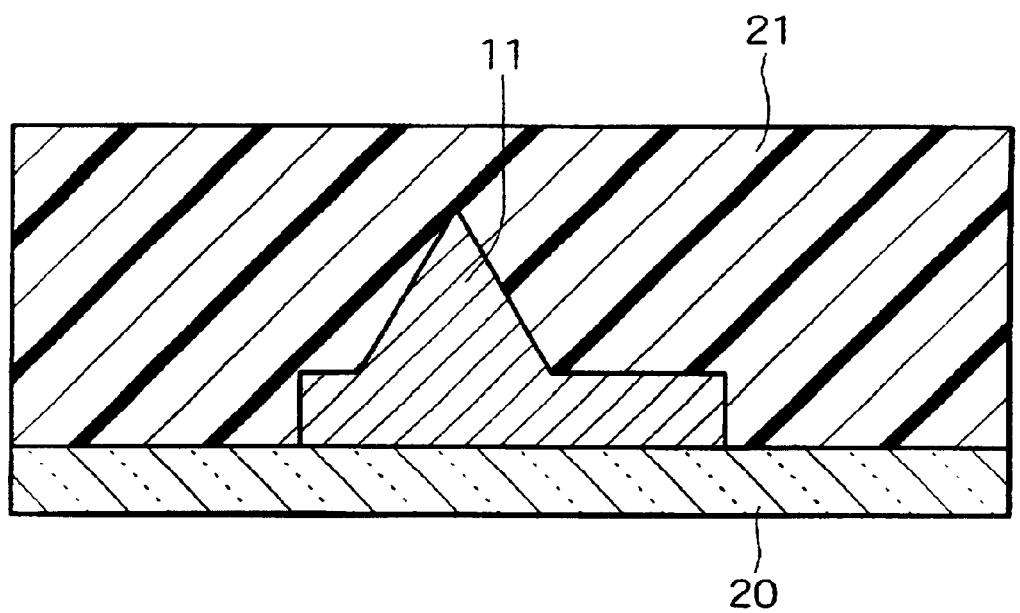
FIG. 1 is a sectional view showing a process of selectively etching back an insulation layer with a hexagonal pyramid shaped semiconductor light-emitting device embedded therein so as to provide the semiconductor light-emitting device with a leadout electrode, particularly showing the condition where the semiconductor light-emitting device is covered and fixed on a substrate surface by an insulation layer.

The display system and the method of producing the same according to the present invention are, as described above, a display system including a plurality of semiconductor light-emitting devices disposed on and fitted to a substrate surface, in which an insulation layer with the semiconductor light-emitting devices embedded therein is thinned selectively or non-selectively, a conductor film is formed on upper end portions of the semiconductor light-emitting devices exposed by the thinning, and upper portion electrodes of the semiconductor light-emitting devices are led out to an upper surface of the insulation layer, and a method of producing the same.

The semiconductor light-emitting device is not particularly limited as to the method of producing the same, constitution of materials or crystal structure, as far as the conductor film is formed on an upper end portion thereof exposed by thinning the insulation layer covering it and the upper end portion electrode is led out to the upper surface of the insulation layer. Namely, the semiconductor light-emitting device may be a minute semiconductor chip, for example, of 300 μm in size diced from a compound semiconductor wafer being a raw material of a light-emitting diode or a semiconductor laser, or an extremely minute semiconductor of 10 to 100 μm in size selectively crystal-grown on a substrate for growth such as sapphire.

In the case of selectively crystal-growing the semiconductor light-emitting device on a substrate, it is preferable that the substrate surface has a lattice constant similar to that of the semiconductor light-emitting device, but it is not indispensable. Ordinarily, (0,0,0,1) plane of sapphire ($Al_2O_3$) is used for growth, but sapphire and GaN semiconductor differ in lattice constant by a factor of not less than 10% and differ also in coefficient of thermal expansion, so that A crack would be generated at the interface therebetween. To avoid this, it is preferable to once form an extremely thin film of GaN as a buffer layer on the (0,0,0,1) plane of sapphire at a low temperature, for example, 500° C., and then grow a crystal of GaN on the buffer layer at a high temperature, for example, 1000° C. For the buffer layer, aluminum nitride (AlN) may also be used. A plane other than the (0,0,0,1) plane, for example, (1,-1,0,1) plane of sapphire may also be used for crystal growth. Besides, other than sapphire, silicon carbide (SiC), gallium nitride (GaN), silicon (Si), gallium arsenide (GaAs) and the like may be used as the substrate for growth, and other substrates may also be used as far as crystal growth thereon is possible.

Where the semiconductor light-emitting device is fixed on a transparent substrate surface and a primary light-emitting direction is the direction from an upper end portion toward the substrate surface side, it is possible to enhance the luminance in the direction toward the substrate surface side, namely, toward the lower end surface side of the semiconductor light-emitting device, depending on the shape of the semiconductor light-emitting device. Of the light emitted from an active layer being a light-emitting region of the semiconductor light-emitting device, the light directed upward from the light-emitting region can be directed toward the lower end surface side with an electrode surface at the upper end portion or the like as a reflective surface, but the light directed toward a side surface perpendicular to the lower end surface is difficultly directed to the lower end surface side even if it is reflected by the side surface. Therefore, it is desirable that the semiconductor light-emitting device has a reflective surface at an acute angle relative to the lower end surface, particularly a slant surface having an angle relative to the lower end surface in the range of 45±20 degrees, at a portion above the light-emitting region; by providing a reflective surface at such a slant surface, the light directed sideways can be reflected to be effectively directed toward the lower end surface. Where the angle of the slant surface relative to the lower end surface is outside the above-mentioned range, the quantity of light toward the lower end surface is not so increased even if the light directed sideways is reflected, and there is recognized little effect of increasing the luminance.

The slant surface may be a shed roof-like slant surface, a gable roof-like slant surface or a hip roof-like slant surface. Furthermore, it is preferable that the semiconductor light-emitting device has a pyramid shape or a truncated pyramid shape. The slant surfaces of the pyramid or truncated pyramid, and the upper surface also in the case of the truncated pyramid, are made to be reflective surfaces, whereby the light emitted by the semiconductor light-emitting device can be more effectively directed toward the lower end surface side. The pyramid or truncated pyramid here includes various pyramids from triangular pyramid, tetragonal pyramid, pentagonal pyramid and hexagonal pyramid to polygonal pyramid similar to cone, and the corresponding truncated pyramids. In addition to these, as a semiconductor light-emitting device having a slant surface at an acute angle relative to the lower end surface, a semiconductor light-emitting device provided at its upper end portion with a caldera-like dent with the above-mentioned slant surface as a slant surface of the dent may be applied. The semiconductor light-emitting device having the slant surface may be one obtained spontaneously by selective crystal growth, or may be one obtained by chamfering after selective crystal growth. As a processing means for obtaining the slant surface, an ion beam or a laser beam can be used. Besides, the slant surface may be obtained at the time of dicing a minute semiconductor light-emitting device from a compound semiconductor wafer.

Of the compound semiconductors used as the semiconductor light-emitting device, gallium phosphide (GaP) emitting green light and gallium arsenide phosphide (GaAsP), aluminum gallium arsenide (AlGaAs) and the like emitting red light belong to the cubic system, so that they become hexahedrons upon selective crystal growth and do not have the above-mentioned slant surface relative to the lower end surface; therefore, it is a favorable selection to provide a slant surface as a reflective surface by after-processing. On the other hand, gallium nitride semiconductor emitting blue light belongs to the hexagonal system, and the gallium nitride semiconductor selectively crystal-grown with (0,0,0,1) plane as the lower end surface on a substrate surface for growth will grow into a hexagonal pyramid shape or a truncated hexagonal pyramid shape having (1,-1,0,1) plane at an angle of about 50 degrees relative to the lower end surface and equivalent surfaces. In this case, excellent light-emitting property is obtained by providing an active layer parallel to the (1,-1,0,1) plane, and when the electrode surface provided on the (1,-1,0,1) plane is made to be a light-reflective surface, light is effectively concentrated toward the lower end surface side, and a semiconductor light-emitting device with an extremely high luminance is provided. In gallium nitride (GaN), a portion of Ga may be replaced by any of aluminum (Al), indium (In) and thallium (Ti) which belong to the same Group as gallium (Ga). Besides, where the angle of (1,–1,0,1) plane relative to (0,0,0,1) plane being the lower end surface is in the range of ±5 degrees, an equivalent light-emitting property is displayed.

In order to dispose and fit on a substrate surface a chip-like minute semiconductor light-emitting device diced from a compound semiconductor wafer or an extremely minute semiconductor light-emitting device selectively crystal-grown on a substrate for growth, an insulation layer is provided on the entire surface of the substrate so as to cover the semiconductor light-emitting device. Where a film of silicon oxide or silicon nitride is formed as the insulation layer by a CVD method or a sputtering method, a display system with good heat resistance can be obtained. Silicon oxide may be PSG (phosphosilicate glass), BSG (borosilicate glass) or BPSG (borophosphosilicate glass). Where such an inorganic material is used as the insulation layer, the semiconductor light-emitting device has excellent heat resistance, but, in many cases, a high temperature is required for application thereof.

Alternatively, the insulation layer may be formed by coating of a high polymeric compound capable of forming a coating film or a glass capable of forming a coating film. The high polymeric compound includes polyimide resin, epoxy resin, vinyl chloride-based copolymeric resin, fluororesin, polycarbonate resin, polyurethane resin, and various synthetic rubbers. A coating film of glass may also be formed. As a glass material capable of forming a coating film, there may be mentioned spin-on-glass which is spin coated at the time of producing a semiconductor device. As compared with the CVD method and the sputtering method, the coating method ensures easier formation of the insulation layer even where the area of the substrate surface is large.

After the semiconductor light-emitting device is embedded in the insulation layer, the insulation layer is selectively or non-selectively thinned to thereby expose an upper end portion of the semiconductor light-emitting device. The thinning is preferably conducted by dry etching, chemical mechanical polishing, or a combination of the two. At this time, either selective thinning in which only the insulation layer is thinned while leaving as it is the semiconductor light-emitting device exposed as the insulation layer is thinned, or non-selective thinning in which the insulation layer is thinned together with the semiconductor light-emitting device, is carried out. When the non-selective thinning is conducted, naturally, the semiconductor light-emitting device and the insulation layer are flush with each other. For the non-selective thinning, the chemical mechanical polishing method is adopted; naturally, other methods may be used.

It is desirable that the dry etching is conducted in an oxygen plasma atmosphere. Naturally, an inert gas such as argon gas may be co-present. Namely, where a high polymeric material is used for the insulation layer, the oxygen plasma directly reacts with the high polymeric material to cause combustion and gasification, so that thinning can be achieved without use of carbon fluoride as etchant gas. Where a silicon compound is used for the insulation layer, the oxygen plasma reacts with the etchant gas, to promote the generation of fluorine radical which will easily associate with silicon. As the chemical mechanical polishing method, that method which is widely used for thinning of a substrate can be used as it is.

After coating of a high polymeric compound or a glass, an excess of the coating liquid may be raked away by a squeegee, a doctor blade or the like before solidification occurs. After the raking, thinning of the insulation layer after the solidification might be unnecessary in some cases, but the insulation layer is usually left in a foil form on an upper end portion of the semiconductor light-emitting device, and, therefore, it is necessary to remove the foil-form insulation layer by dry etching after the solidification.

After the upper end portion of the semiconductor light-emitting device is exposed by the selective or non-selective thinning of the insulation layer, a conductor film is formed thereon. In this case, it is desirable that the same kind of metal as the upper end portion electrode of the semiconductor light-emitting device is used for forming the conductor film. By such selection, as contrasted to the case of laminating different metals, secure joint between the upper portion electrode and the conductor film can be obtained without taking into account the easiness of alloying at the interface of an alloy or a difference in coefficient of thermal expansion.

As the method of forming the conductor film, a method may be adopted in which the semiconductor light-emitting device is embedded in the insulation layer without providing the upper portion electrode on the second conduction type semiconductor (p-type semiconductor) layer, and, for example, an Al film is formed on the second conduction type semiconductor layer exposed in the same manner as above-mentioned, whereby the upper portion electrode (p electrode) and the conductor film are formed as one body with each other; in this case, the process step is simplified. Where a metal layer for obtaining ohmic contact is provided on the second conduction type semiconductor layer before formation of the Al film, a more favorable result is obtained.

The gallium nitride semiconductor light-emitting device emitting blue light has a structure in which, for example, an active layer and a p-type semiconductor as the second conduction type semiconductor are sequentially laminated on an n-type semiconductor as the first conduction type semiconductor. An upper end portion electrode (p electrode) is attached to the p-type semiconductor, while a lower end portion electrode (n electrode) is attached to the n-type semiconductor, and an electric current is injected into the active layer to generate light, which is picked up. Such a semiconductor light-emitting device has the merit that the light passing from the active layer toward the upper end portion is reflected at the interface of the p electrode and can be added to the light passing from the active layer toward the transparent substrate located at the lower end. It is a rational practice to intermediately provide a contact metal layer between the p-type semiconductor and the p electrode, in order to obtain ohmic contact. Naturally, it is also a rational practice to intermediately provide a contact metal layer between the n-type semiconductor and the n electrode.

However, it has been found that where the light passing from the active layer toward the upper end portion is reflected by the interface of the p electrode, a sufficient reflectance cannot be obtained when the thickness of the contact metal layer is enlarged. Namely, it has been recognized that where the semiconductor light-emitting device is provided with the contact metal layer, the reflectance is enhanced by forming the metal layer of Ni, Co or Sb in a thickness of not greater than the penetration length of light.

More in concrete, it has been confirmed that the reflectance is enhanced when the thickness of the contact metal layer is not more than 20 nm, more effectively and preferably not more than 10 nm, further preferably not more than 5 nm, and well effectively 1 nm. Accordingly, the semiconductor light-emitting device used in the present invention includes those in which an upper portion electrode is fitted to a second conduction type semiconductor layer with the contact metal layer restricted in thickness as above-mentioned therebetween.

Figure 14:
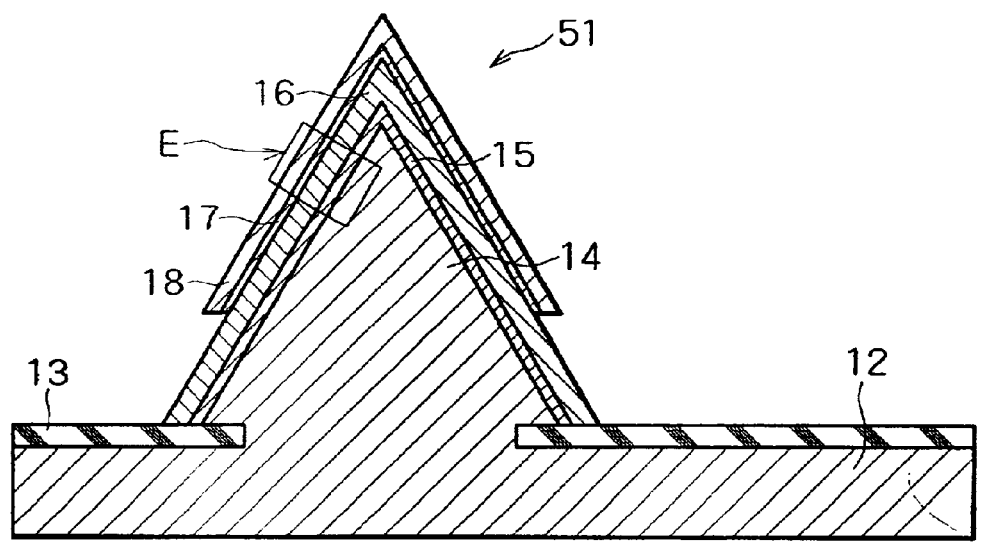
FIG. 14 is a sectional view of an example of a semiconductor light-emitting device used in the present invention.

FIG. 14 is a sectional view of one example of a gallium nitride semiconductor light-emitting device used in the present invention. The semiconductor light-emitting device 51 includes a light-emitting portion formed by laminating a GaN compound semiconductor, and has a structure in which an Si-doped n-type gallium nitride (GaN:Si) layer 14, an InGaN active layer 15 emitting light, and an Mg-doped p-type gallium nitride (Ga:Mg) layer 16 are laminated on a transparent sapphire substrate (not shown) through a GaN buffer layer. The Si-doped n-type GaN layer 14 functions as a first conduction type clad layer, while the Mg-doped p-type GaN layer 16 functions as a second conduction type clad layer, and the present device has a double hetero structure.

An Ni layer 17 being a contact metal layer for contriving ohmic contact is further provided on the p-type GaN layer 16 being the second conduction type clad layer. The thickness of the Ni layer 17 is set to be not more than the penetration length of the light emitted from the active layer 15 as described later, and one example of the thickness is about 10 nm. A p electrode 18 formed on the Ni layer 17 is a thin film of, for example, Al or Ag, and the light penetrating through the Ni layer 17 being the contact metal layer is reflected at the interface of the p electrode 18. The p electrode 18 is not limited to a thin film of Al or Ag, but may have a structure in which a metal layer of Au or Pt or the like is laminated on Al or Ag. An electrode is also provided either on a lower end surface of a flat plate-like ground portion 12 formed of an n-type GaN semiconductor, or by opening a portion of a mask 13, but the electrode is not shown in FIG. 14.

Figure 15:
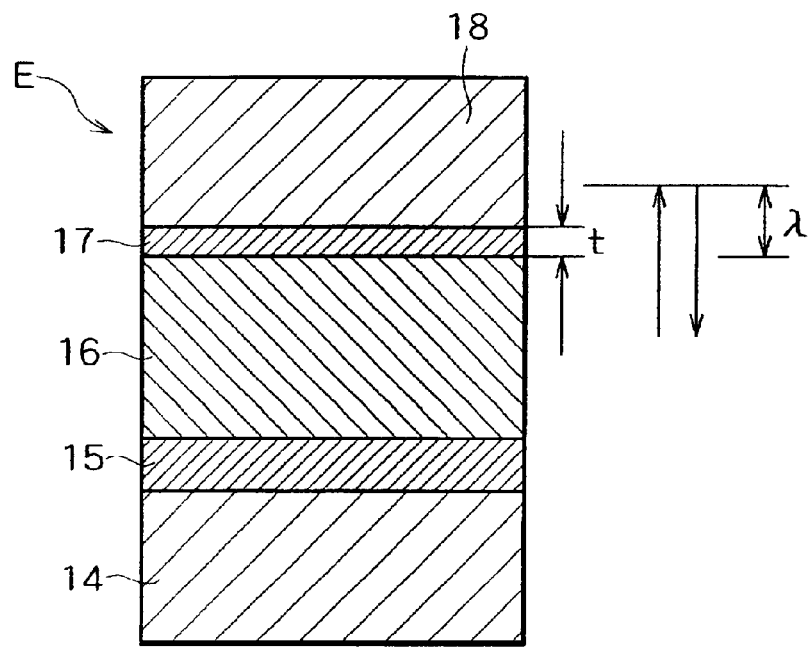
FIG. 15 is an enlarged view of the portion surrounded by a rectangle in FIG. 14.

FIG. 15 is an enlarged sectional view of the portion surrounded by a rectangle E in FIG. 14. As shown in FIG. 15, the gallium nitride semiconductor light-emitting device 51 has a double hetero structure in which the InGaN active layer 15 is intermediately provided between the n-type GaN layer 14 and the p-type GaN layer 16 which are clad layers, the Ni layer 17 being a contact metal layer for contriving ohmic contact is provided on the upper side of the p-type GaN layer 16, and the p electrode 18 of Al or Ag is provided on the Ni layer 17. The thickness t of the Ni layer 17 is set to be not more than the penetration length of the light emitted, for example, set to be about 10 nm. The thickness t can be varied according to the light emitted, and, further, according to the quality of the film formed by a vapor deposition method, a plating method or the like, or the like factors. Where light is reflected by a metal surface, the light as an electromagnetic wave having energy penetrates from the metal surface by a length called penetration length, and is reflected by receiving the same energy through a phonon interaction in the case of perfect reflection. On the other hand, in order to achieve ohmic contact, an extremely thin film is sufficient. From the experimental results obtained by the present inventors, a light-emitting operation has been confirmed even when the thickness t of the Ni layer 17 is as extremely small as, for example, 1 nm. In view of this, the thickness t of the Ni layer 17 is set to be not more than the penetration length of the light generated at the active layer 15, whereby the reflecting efficiency at the p-type electrode 18 on the upper side can be enhanced.

Figure 16:
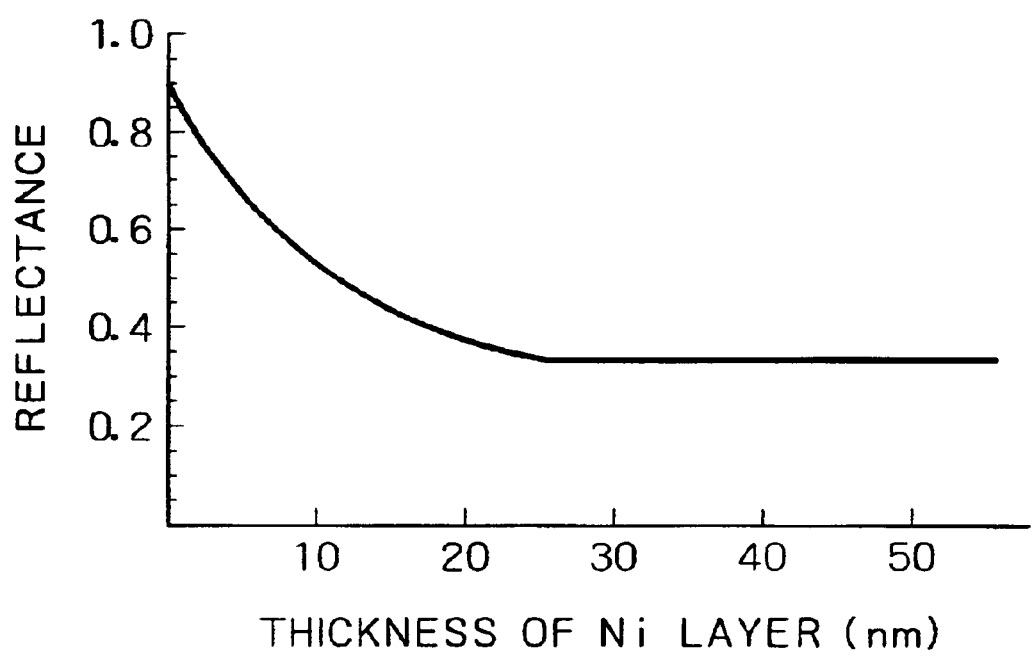
FIG. 16 is a characteristic diagram in which the dependency of the reflectance of a GaN/Ni/Ag laminate structure on the thickness of the Ni layer.
Figure 17A:
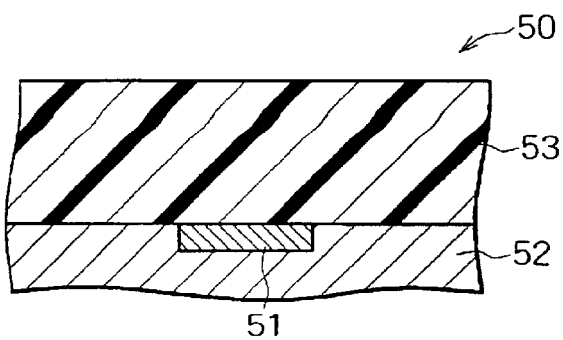
Figure 17B:
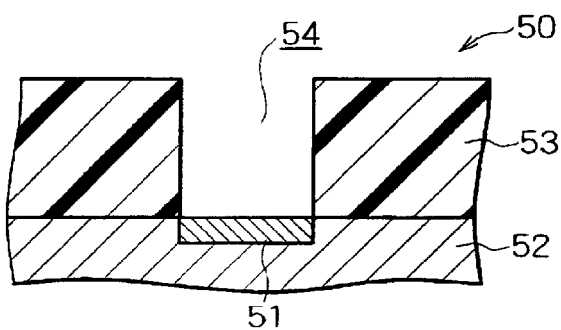
Figure 17C:
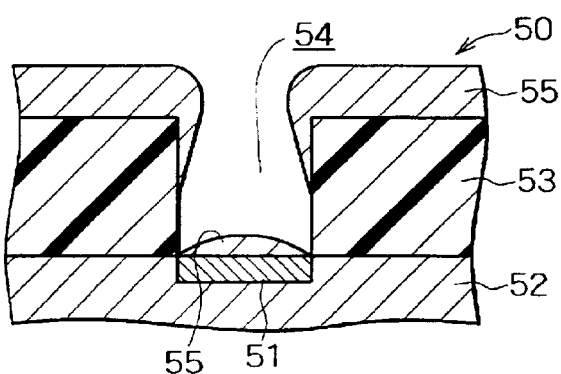
Figure 17D:
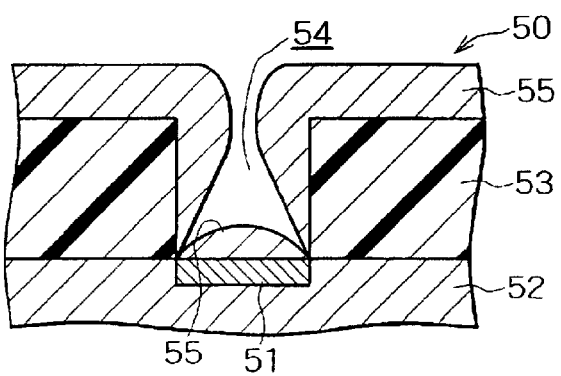
Figure 18A:
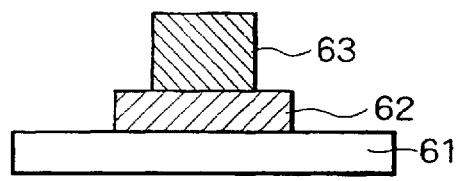
Figure 18B:
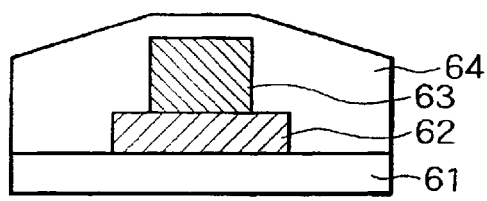
Figure 18C:
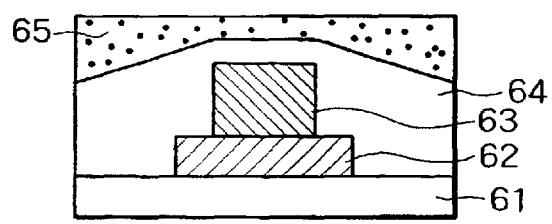
Figure 18D:
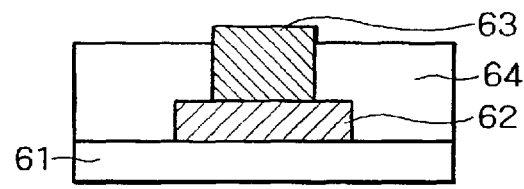
Figure 18E:
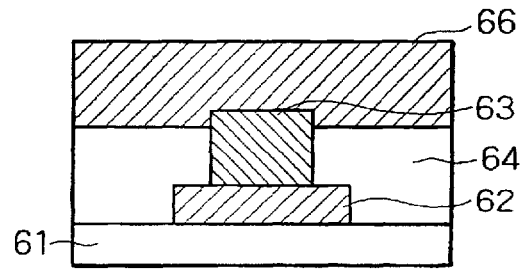
Figure 19A:
Figure 19B:
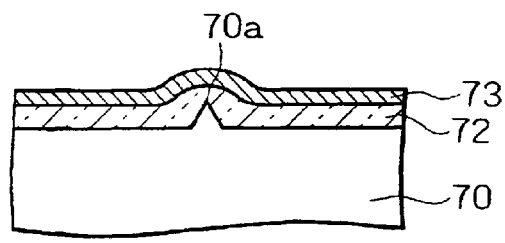
Figure 19C:
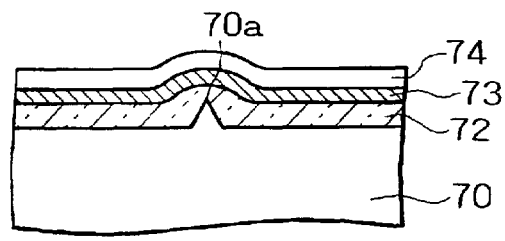
Figure 19D:
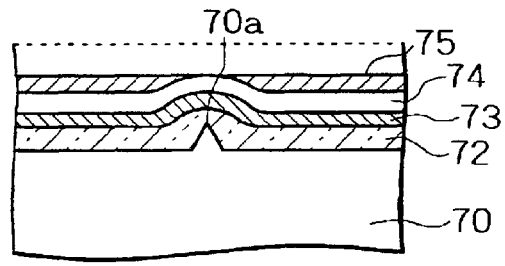
Figure 19E:
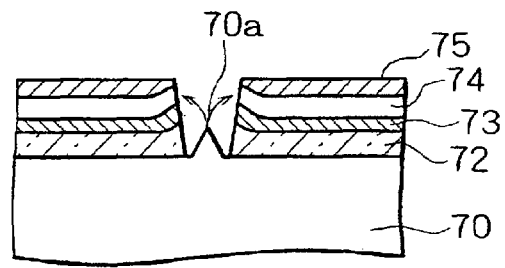

FIG. 16 shows reflectance calculated by reflecting the emitted light while varying the thickness t of the Ni layer in a laminated structure of GaN layer, Ni layer and Ag layer (electrode). As shown in FIG. 16, there is a tendency that the reflectance is higher as the thickness t of the Ni layer is smaller, and the reflectance decreases as the thickness of the Ni layer increases. Where the thickness exceeds 20 nm, the reflectance in relative value is not more than 0.4, and, in order to obtain a reflectance of not less than 0.4, it is necessary that the thickness t of the Ni layer is not more than 20 nm, preferably not more than 10 nm. Furthermore, in order to obtain a reflectance of not less than 0.6, the thickness t of the Ni layer is desirably not more than 5 nm. The same fact has been recognized also in the case of varying the thickness of the Ni layer in a laminated structure of GaN layer, Ni layer and Al layer (electrode), and it is recognized that in order to obtain a reflectance of not less than 0.5, it is necessary that the thickness of the Ni layer is not more than 20 nm.

As has been described above, the light-emitting diodes being semiconductor light-emitting devices include those which emit light respectively in red color (R), green color (G), and blue color (B). Therefore, by constituting pixels by combining these light-emitting diodes, it is possible to obtain a full-color image display system with high luminance. Naturally, by arranging only monochromic, for example, red color light-emitting diodes in two dimensions, it is possible to obtain a display system in which the shape of the image is varied with time through programmed switching. It is easy to obtain a semiconductor laser by providing the above-mentioned light-emitting diode with a resonance mirror, and, therefore, it is possible to produce an illumination system or traffic markers by using a monochromic semiconductor laser or a combination of three primary color semiconductor lasers.

EXAMPLES

Now, the display system and the method of producing the same according to the present invention will be described in detail below, referring to Examples and the drawings.

Example 1

FIGS. 1 to 4 are sectional views showing a process of producing a semiconductor light-emitting device used for a display system. FIG. 1 shows the condition where a light-emitting diode 11 being a semiconductor light-emitting device crystal-grown in a hexagonal pyramid shape is disposed on a substrate 20, and an insulation layer 21 is provided so as to embed the light-emitting diode 11.

Figure 5A:
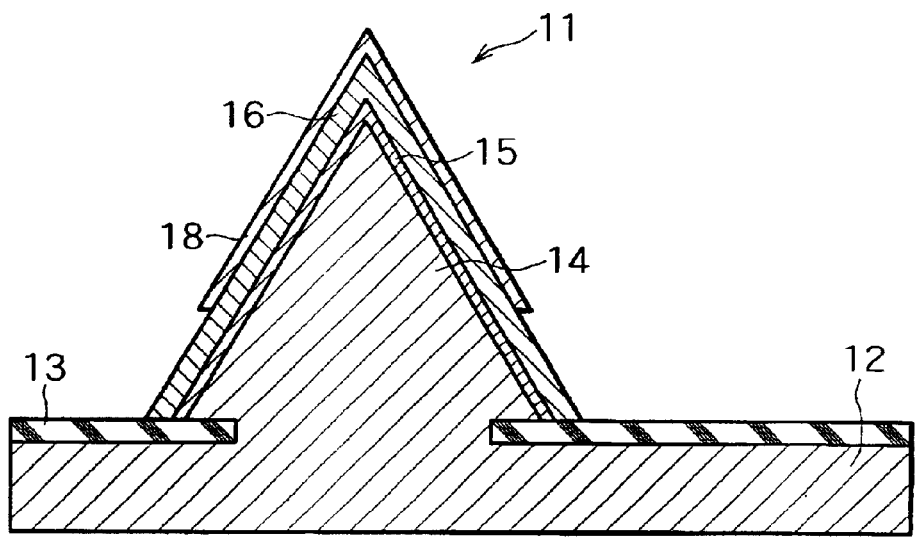
Figure 5B:
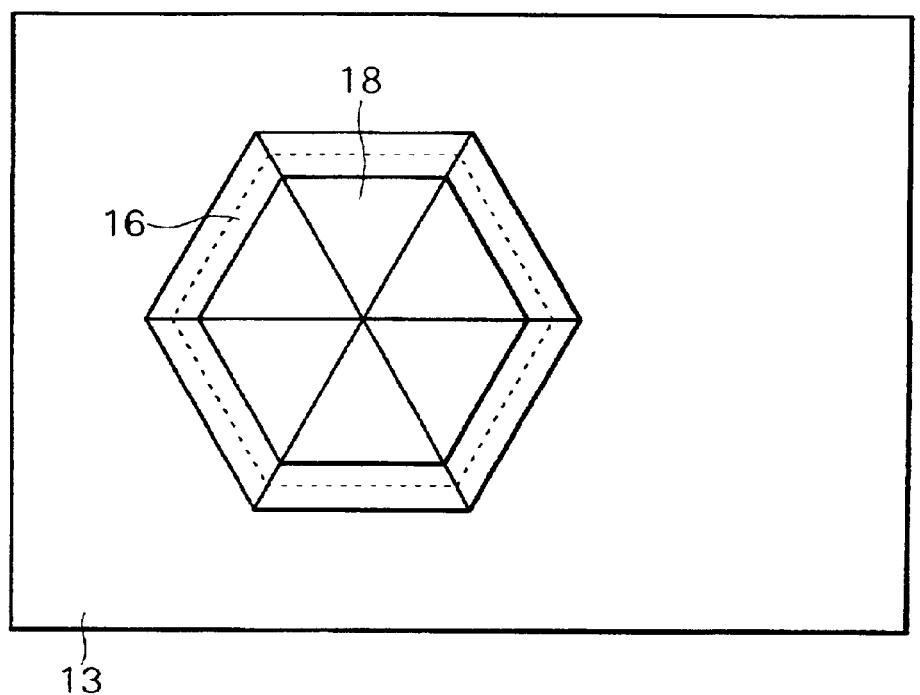
Figure 6:
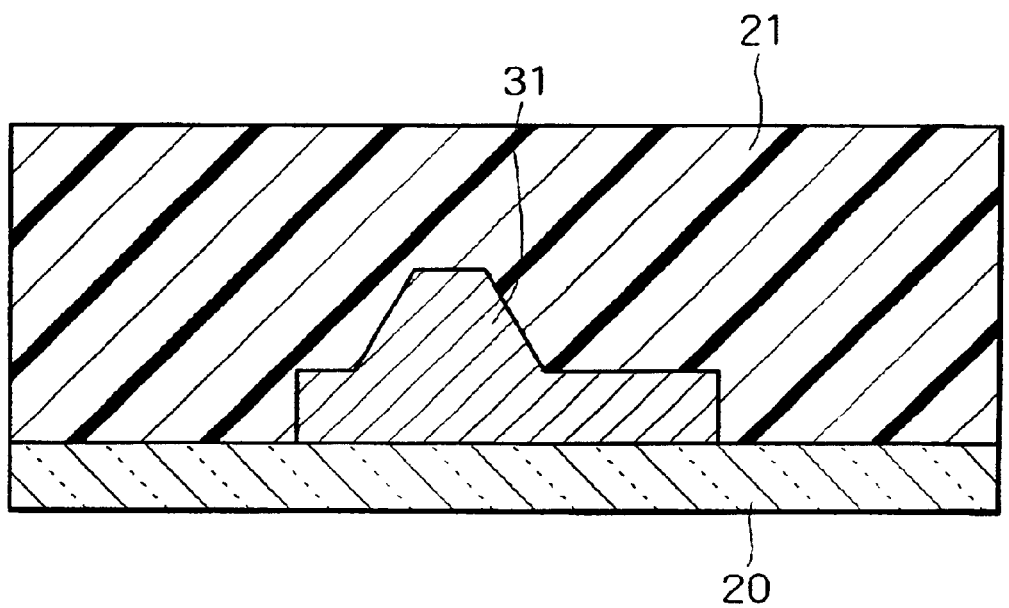
FIG. 6 is a sectional view showing a process of selectively etching back the insulation layer to provide a truncated hexagonal pyramid shaped semiconductor light-emitting device with a lead-out electrode, particularly showing the condition where the truncated hexagonal pyramid shaped semiconductor light-emitting device is covered and fixed on a substrate surface by an insulation layer.

Details of the light-emitting diode 11 are shown in a sectional view of FIG. 5A and a plan view of FIG. 5B. An extremely thin GaN buffer layer is grown at a temperature of 500° C. at an opening portion of an $SiO_2$ mask on (0,0,0,1) plane of a sapphire substrate (not shown), then a silicon-doped n-type gallium nitride (GaN:Si) is grown at 1000° C. in a flat plate shape to form a ground portion 12 shown in FIG. 5A, and, at an opening portion of an $SiO_2$ mask 13 provided thereon, crystal growth is conducted at a temperature of 1000° C. to obtain a hexagonal pyramid shaped n-type (GaN:Si) 14. An active layer 15 consisting of InGaN is provided at a lower growth temperature on (1,-1,0,1) plane and equivalent slant surfaces which are slant surfaces of the hexagonal pyramid, then a magnesium-doped p-type gallium nitride (GaN:Mg) 16 is grown thereon, and a p electrode 18 is provided on the surface of the p-type gallium nitride layer 16 by vapor deposition. Namely, the contact metal layer 17 in FIG. 14 mentioned above is not provided. An electrode is also provided on the lower end surface of the flat plate shaped ground portion 12 consisting of an n-type gallium nitride semiconductor, or by opening a portion of the mask 13, but the electrode is not shown in FIG. 5.

FIG. 1 simply shows the condition where the GaN light-emitting diode 11 formed as mentioned above is transferred onto the substrate 20 and is fixed by providing the insulation layer 21 so as to cover the GaN light-emitting diode 11 with an epoxy resin.

Figure 2:
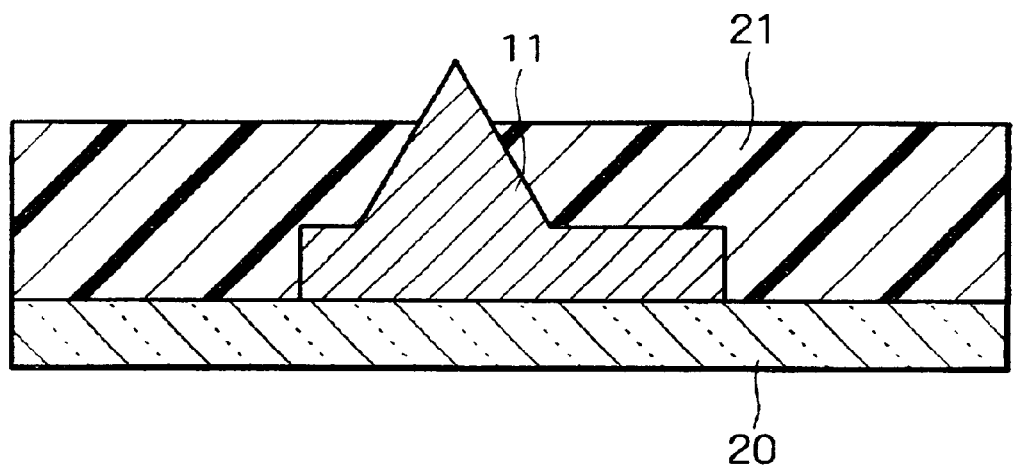
FIG. 2 is a sectional view showing a step continued from FIG. 1, particularly showing the condition where the insulation layer of FIG. 1 has been selectively etched back and an upper end portion of the semiconductor light-emitting device is exposed.
Figure 3:
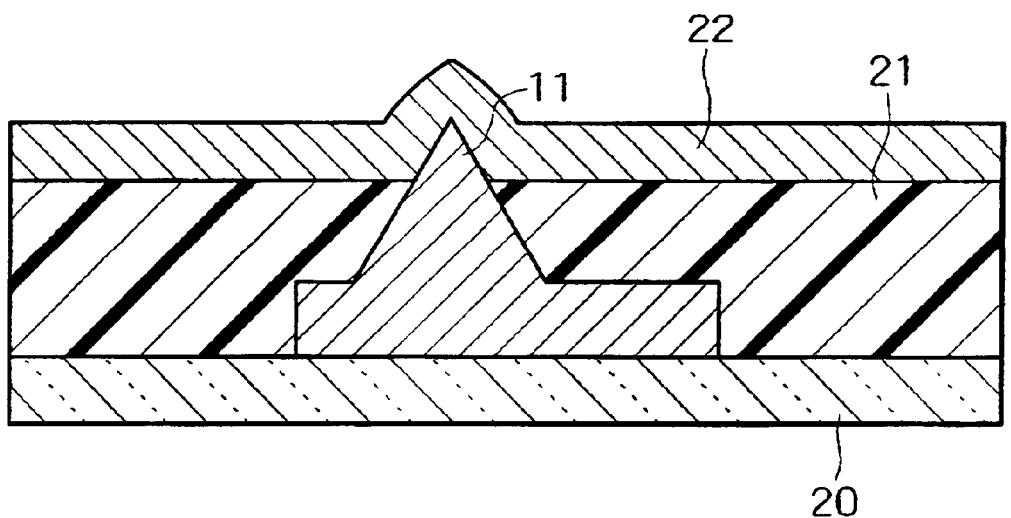
FIG. 3 is a sectional view showing a step continued from FIG. 1, particularly showing the condition where a conductor film is formed on an upper surface of the etched-back insulation layer of FIG. 2.

FIG. 2 shows the condition where an upper end portion of the light-emitting diode 11 has been exposed by selective etching-back of the insulation layer 21 of the epoxy resin of FIG. 1 by dry etching in an oxygen plasma atmosphere, and an upper end portion electrode 18 of the light-emitting diode 11 shown in FIG. 5 has been exposed. FIG. 3 shows the condition where a conductor film 22 composed of Al has been formed on the surface of the etched-back insulation layer 21; in this case, naturally, the conductor film 22 is protuberant on the upper side of the upper end portion of the light-emitting diode 11.

Figure 4:
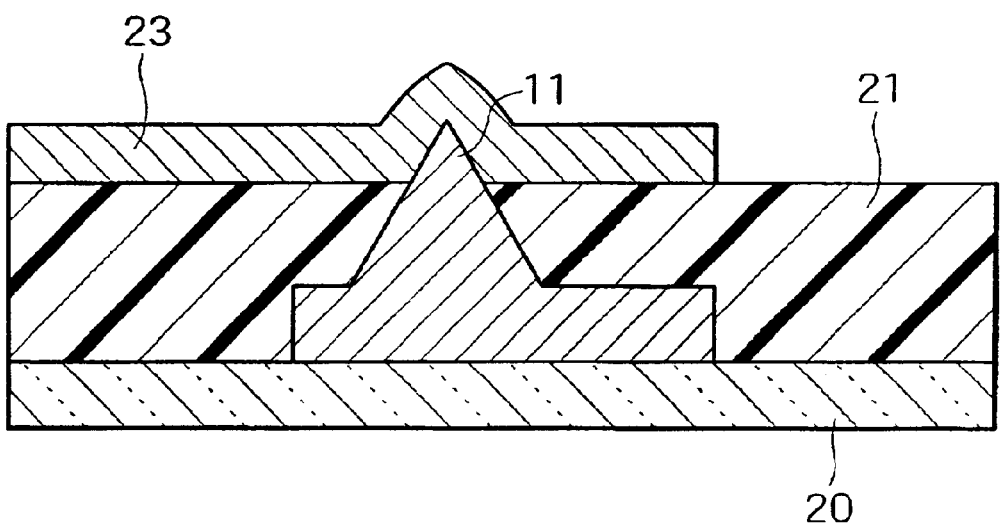
FIG. 4 is a sectional view showing a step continued from FIG. 1, particularly showing the condition where a required portion of the conductor film of FIG. 3 is left as a lead-out electrode and the unrequired portion has been removed.

FIG. 4 shows the condition where a required portion of the conductor film 22 has been left as a lead-out electrode 23 while the unrequired portion has been removed, by lithography. Though not shown in FIG. 4, the lead-out electrode from the ground portion 12 of the n-type (GaN:Si) semiconductor may be provided by use of a substrate 20 preliminarily provided with the lead-out electrode, and, when the substrate 20 is not preliminarily provided with the lead-out electrode, the lead-out electrode may be provided at a peripheral portion of the lower end surface of the hexagonal pyramid shape or provided by covering the entire surface of the lower end surface with a lead-out transparent electrode and jointing it to a final substrate, after separation from the substrate 20. Naturally, the electrode may be led out by other methods. Besides, in place of the Al conductor film 22 formed on the Ni/Au p electrode 18 in the above description, a conductor film 22 formed of the same Au as the Au of the p electrode 18 was formed, and, as a result, a lead-out electrode 23 jointed to the p electrode 18 more securely was obtained.

Example 2

While the case of using a hexagonal pyramid shaped gallium nitride semiconductor has been described in Example 1, the case of using a truncated hexagonal pyramid shaped gallium nitride semiconductor used for a display system will be described in the present invention referring to FIGS. 6 to 9. Namely, the gallium nitride semiconductor assumes a truncated hexagonal pyramid shape when sufficient time is not given to crystal growth, and FIG. 6 simply shows the condition where such a truncated hexagonal pyramid shaped gallium nitride semiconductor 31 is fixed on a substrate 20 while being covered by an insulation layer 21. The gallium nitride semiconductor 31 has a constitution in which a silicon-doped n-type gallium nitride (GaN:Si) is selectively crystal-grown into a truncated hexagonal pyramid shape, an InGaN active layer is grown on the (0,0,0,1) plane being the upper surface of the truncated hexagonal pyramid and the (1,-1,0,1) plane being a slant surface of the truncated hexagonal pyramid, further a magnesium-doped p-type gallium nitride is grown thereon, an Ni layer in a thickness of about 10 nm as a contact metal layer is vapor-deposited on the surface of the p-type gallium nitride semiconductor at an upper end portion, and an Al layer in a thickness of about 100 nm is vapor-deposited thereon to provide a p electrode as an upper end portion electrode. Then, the GaN light-emitting diode 31 formed as above is fixed on the substrate 20 by providing an insulation layer 21 by applying an epoxy resin so as to cover the GaN light-emitting diode 31.

Figure 7:
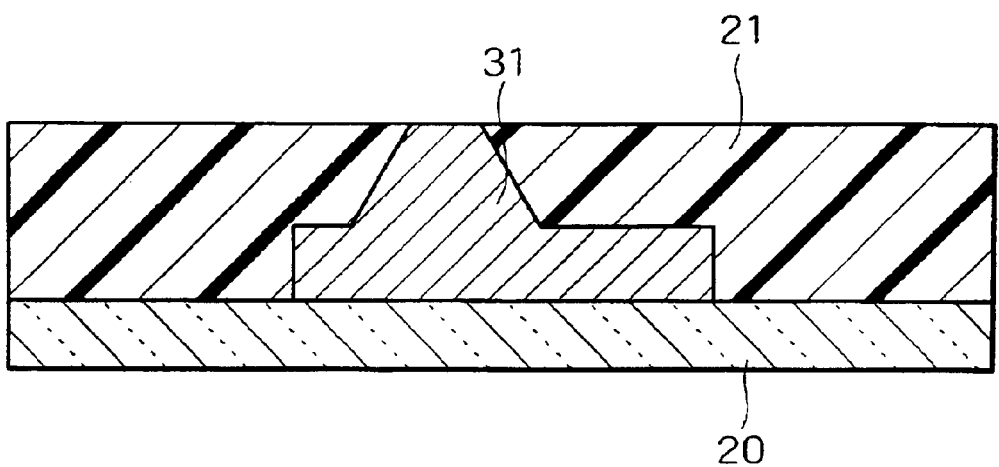
FIG. 7 is a sectional view showing a step continued from FIG. 6, particularly showing the condition where the insulation layer of FIG. 6 has been selectively etched back and an upper surface of the truncated hexagonal pyramid shaped semiconductor light-emitting device is exposed to be flush with the upper surface of the insulation layer.
Figure 8:
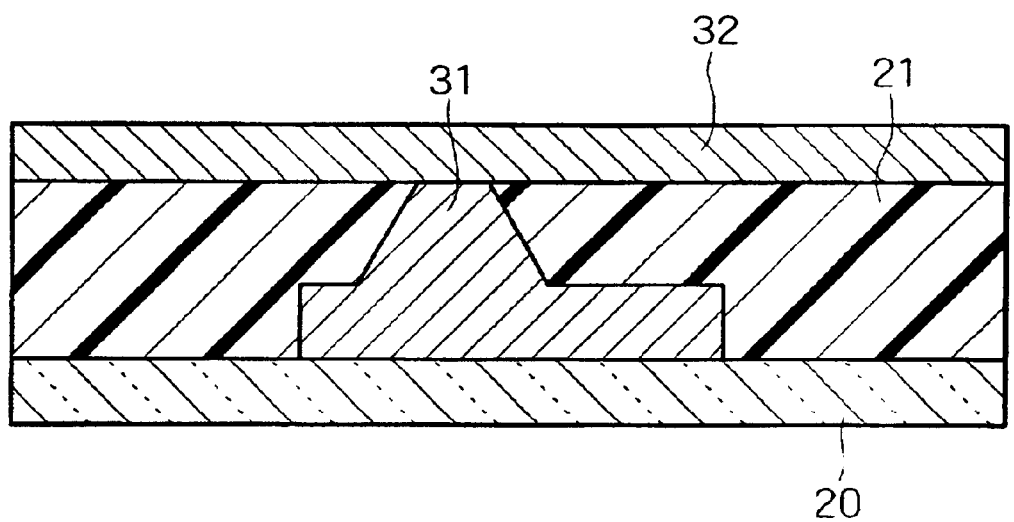
FIG. 8 is a sectional view showing a step continued from FIG. 6, particularly showing the condition where a conductor film is formed on the upper surfaces of the etched-back insulation layer and the semiconductor light-emitting device of FIG. 7.
Figure 9:
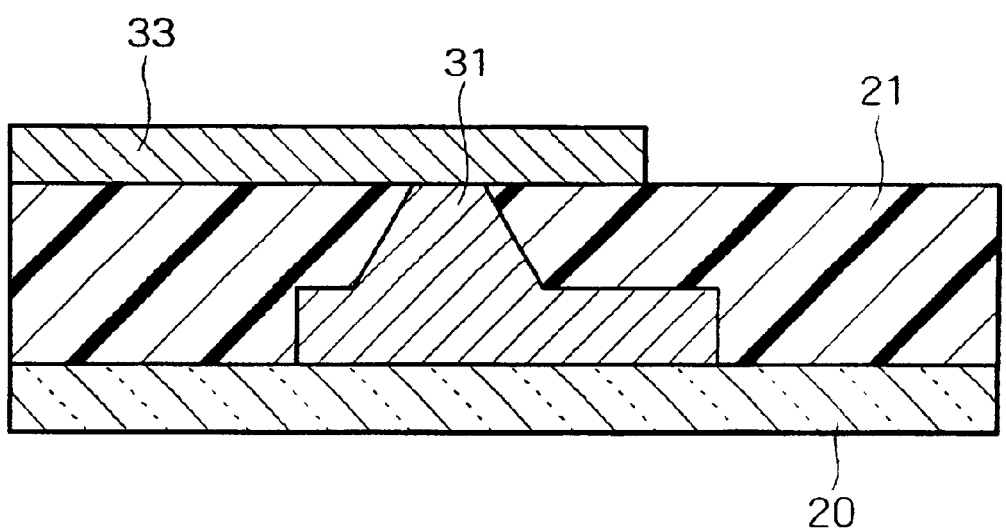
FIG. 9 is a sectional view showing a step continued from FIG. 6, particularly showing the condition where a required portion of the conductor film of FIG. 8 is left as a lead-out electrode and the unrequired portion has been removed.

FIG. 7 shows the condition where an Al layer of a p electrode on the (0,0,0,1) plane being the upper surface of a truncated hexagonal pyramid shaped gallium nitride semiconductor 31 has been exposed by selectively etching back the insulation layer 21 in the same manner as in Example 1. FIG. 8 shows the condition where a conductor film 32 of the same Al as the p electrode has been formed on the entire area of the etched-back surface, and FIG. 9 shows the condition where a required portion of the conductor film 32 has been left as a lead-out electrode 33 while the unrequired portion has been removed, by lithography. FIG. 9 does not show the lead-out of the n-type electrode, but the lead-out is conducted in the same manner as in Example 1.

Example 3

Figure 10:
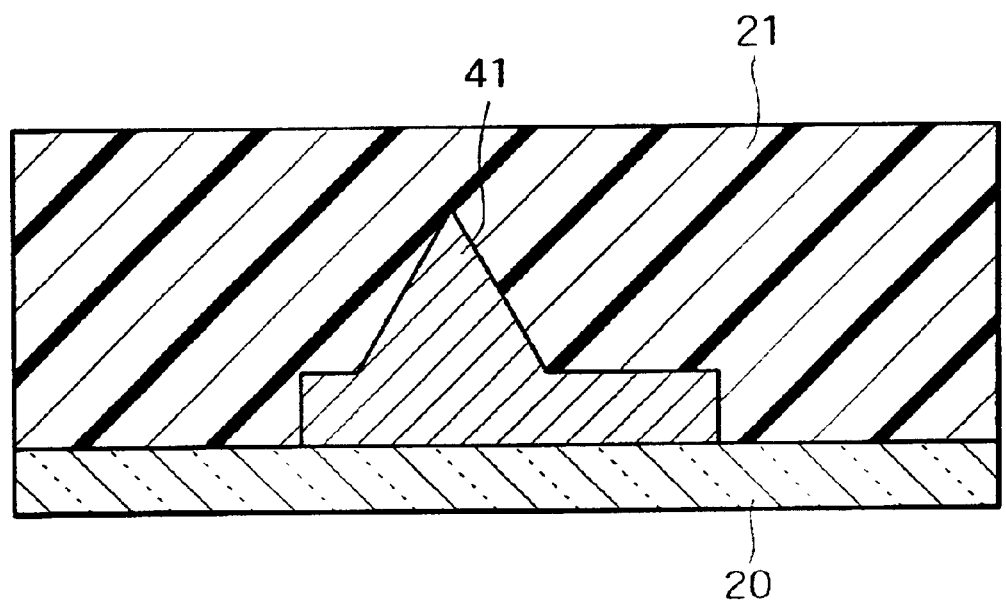
FIG. 10 is a sectional view showing a process of providing a hexagonal pyramid shaped semiconductor light-emitting device with a lead-out electrode by nonselective thinning, particularly showing the condition where the hexagonal pyramid shaped semiconductor light-emitting device is covered and fixed on a substrate surface by an insulation layer.
Figure 11:
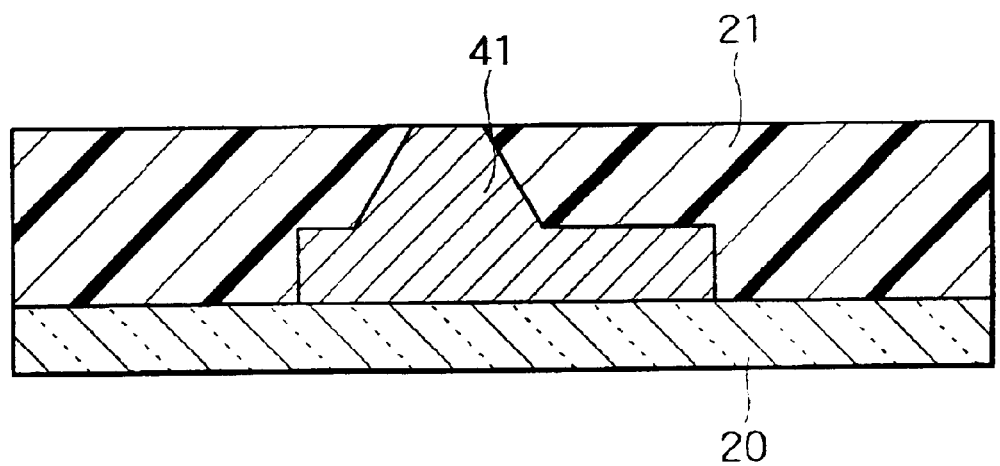
FIG. 11 is a sectional view showing a step continued from FIG. 10, particularly showing the condition where the insulation layer of FIG. 10 has been non-selectively thinned, an upper end portion of the hexagonal pyramid shaped semiconductor light-emitting device has been ground together with the insulation layer, and the semiconductor light-emitting device is exposed to be flush with the upper surface of the insulation layer.
Figure 12:
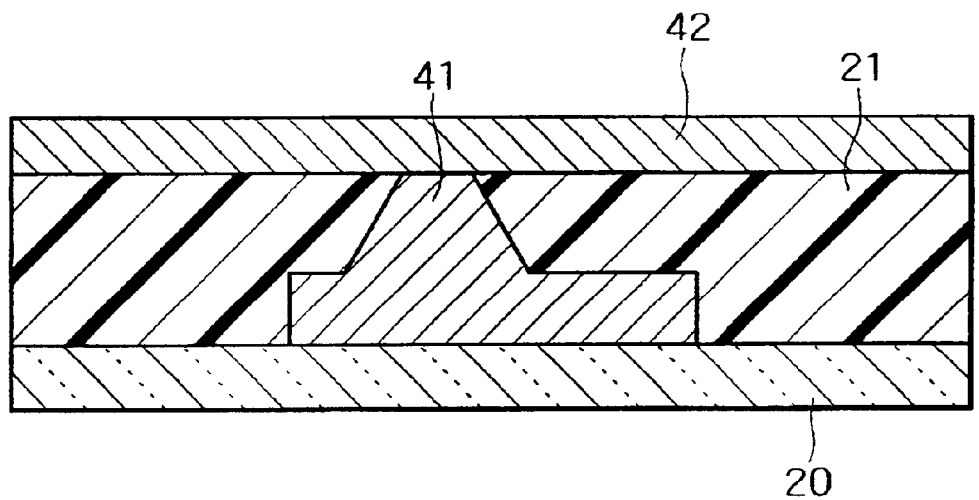
FIG. 12 is a sectional view showing a step continued from FIG. 10, particularly showing the condition where a conductive film is formed on the upper surfaces of the thinned insulation layer and the semiconductor light-emitting device of FIG. 11.
Figure 13:
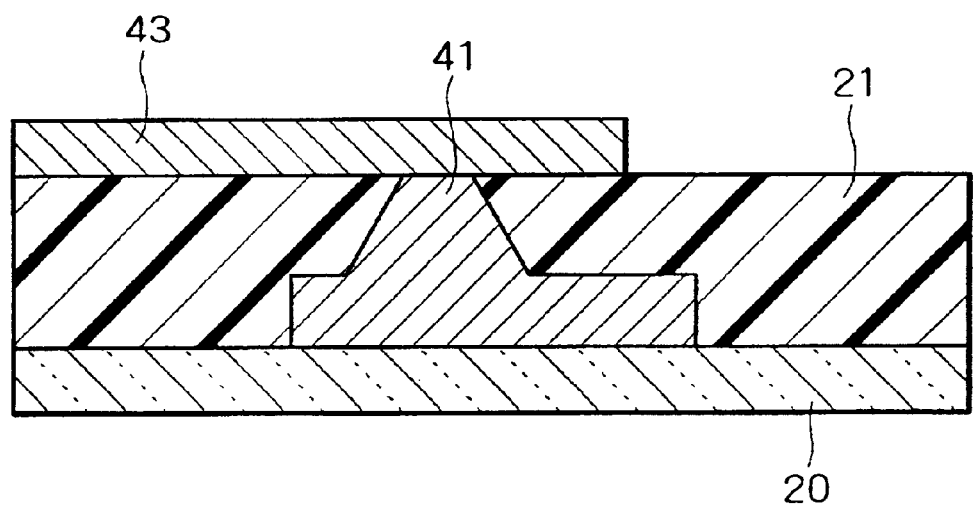
FIG. 13 is a sectional view showing a step continued from FIG. 10, particularly showing the condition where a required portion of the conductor film of FIG. 12 is left as a lead-out electrode and the unrequired portion has been removed.

While the cases of selectively thinning only the insulation layer 21 have been described in Examples 1 and 2, the case of non-selectively thinning the insulation layer 21 together with the semiconductor light-emitting device will be described in Example 3, referring to FIGS. 10 to 13. FIG. 10 is a figure similar to FIG. 1 in Example 1, and a hexagonal pyramid shaped GaN light-emitting diode 41 used here is not provided with a p electrode 18, different from the one shown in FIG. 5. Namely, FIG. 10 shows the condition where such a GaN light-emitting diode 41 has been fixed on a substrate 20 by covering it with an insulation layer 21 of an epoxy resin. FIG. 11 shows the condition where thinning has been conducted by non-selective chemical mechanical polishing for grinding the GaN light-emitting diode 41 also together with the insulation layer 21, whereby the ground surface of the insulation layer 21 and the ground surface of the GaN light-emitting diode 41 have been made flush with each other. At this time, the outer peripheral portion of the ground surface of the light-emitting diode 41 is the ground surface of the p-type semiconductor. FIG. 12 shows the condition where a p electrode has been formed and, simultaneously, a conductor film 42 has been formed as one body with the p electrode, by vapor deposition of Al on the ground surfaces of FIG. 11. At this time, it is natural that the conductor film 42 may be formed after formation of a contact metal layer. FIG. 13 shows the condition where a required portion of the conductor film 42 has been left as a lead-out electrode 43 while the unrequired portion has been removed, by lithography. Though not shown in FIG. 13, lead-out of an n-type electrode is conducted in the same manner as in Example 1.

While the display system and the method of producing the same according to the present invention have been described through Examples as above, the invention is not limited to the Examples, and various modifications can be made based on the technical concept of the invention.

For example, while a hexagonal pyramid shaped or truncated hexagonal pyramid shaped GaN light-emitting diode 11 crystal-grown on (0,0,0,1) plane of sapphire and having (0,0,0,1) plane as the lower end surface and (1,-1,0,1) plane as the slant surface has been illustrated in the present examples, other GaN light-emitting diodes, for example, those semiconductor light-emitting devices obtained from a hexagonal column shaped GaN semiconductor obtained by selective crystal growth on the (0,0,0,1) plane of sapphire, a hexagonal system GaN semiconductor having a reversed boat bottom shape and having (1,1,−2,2) plane and (1,−1, 0,1) plane, and a hexagonal system GaN semiconductor crystal-grown on the (1,−1,0,1) plane of sapphire, also have the merit that the upper end portion electrode can be led out by covering the semiconductor light-emitting device with the insulation layer and thinning the insulation layer, without providing a contact hole.

In addition, while a blue color light-emitting device using a hexagonal system GaN semiconductor has been illustrated in the present examples, the present invention can be applied also in the cases of semiconductor light-emitting devices using other compound semiconductors. For example, gallium phosphide (GaP) emitting green color light as well as gallium arsenide phosphite (GaAsP) and aluminum gallium arsenide (AlGaAs) emitting red color light belong to the cubic system, and selective crystal growth thereof on a substrate for growth gives a hexahedron, and semiconductor light-emitting devices using them also have the merit that the electrode at the upper end portion can be led out by covering the semiconductor light-emitting device with an insulation layer and then thinning the insulation layer, without providing a contact hole. Therefore, a full-color display system can be produced by combining the three primary color semiconductor light-emitting devices including the semiconductor light-emitting device using gallium nitride which emits blue color light.

Besides, while a GaN semiconductor light-emitting device 11 having a p-type semiconductor 16 on the upper side and an n-type semiconductor 14 on the lower side as shown in FIG. 5 has been shown in the present examples, a semiconductor light-emitting device in which the positions of the semiconductors are reversed may also be applied.

In addition, while a light-emitting diode is illustrated as the semiconductor light-emitting device in the present examples, a semiconductor laser can be obtained by providing the light-emitting diode with a resonator and, therefore, it is possible to produce an illumination system using the semiconductor laser in place of the light-emitting diode.

The present invention is not limited to the details of the above described preferred embodiments. The scope of the invention is defined by the appended claims and all changes and modifications as fall within the equivalence of the scope of the claims are therefore to be embraced by the invention.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A display system comprising;
   a plurality of semiconductor light-emitting devices embedded in an insulation of said semiconductor light-emitting devices having a lower end surface disposed on a substrate, an exposed upper end portion and a light-emitting region proveded between said lower end surface and siad upper ind portion, wherein a planar surface of the insulation layer is coplanar with the exposed upper end portion; and
   a conductor film proveded on an upper surface of said insulation layer and in contact with an upper end portion electrode on said exposed upper end portions of said semicondutor light-emitting devices;
   where said light-emitting region is at a slant angle relative to said lower end surface.

2. A display system as set forth in claim 1, wherein said insulation layer is composed of a high polymeric compound capable of forming a coating film containing one of a polyimide resin, an epoxy resin or a synthetic rubber.

3. A display system as set forth in claim 1, wherein the insulation layer is composed of a glass capable of forming a coating film.

4. A display system as set forth in claim 1, wherein said insulation layer is composed of silicon oxide or silicon nitride formed by a chemical vapor deposition method or a sputtering method.

5. A display system as set forth in claim 1, wherein said insulation layer is formed by thinning said insulation layer by an etching method under an oxygen plasma atmosphere, a chemical mechanical polishing method or a combination of both a dry etching method under an oxygen plasma atmosphere and a chemical mechanical polishing method.

6. A display system as set forth in claim 1, wherein each said semiconductor light-emitting device has a primary light-emitting direction in the direction from said light-emitting region toward a lower end surface on said substrate surface, and said light-emitting region includes at least one reflective surface for directing light in said primary light-emitting direction.

7. A display system as set forth in claim 6, wherein each said semiconductor light-emitting device is formed in a pyramid shape or a truncated pyramid shape, and having at least one slant surface as said reflective surface.

8. A display system as set forth in claim 6, wherein each said semiconductor light-emitting device is composed of a hexagonal crystal of a gallium nitride semiconductor, and comprises at least an active layer parallel to (1,−1,0,1) plane.

9. A display system as set forth in claim 8, wherein each said semiconductor light-emitting device is composed of a gallium nitride semiconductor selectively crystal-grown in a hexagonal pyramid shape or a truncated hexagonal pyramid shape with (0,0,0,1) plane as said lower end surface and with (1,−1,0,1) plane and an equivalent surface as said slant surface, on a substrate surface of growth, and comprises an active layer parallel to (1,−1,0,1) plane and an equivalent surface.

10. A display system as set forth in claim 1, wherein said display system is an image display system or an illumination system comprising said semiconductor light-emitting devices which emit monochromic light or a combination of a plurality of kinds of said semiconductor light-emitting devices which emit different-colored lights.

11. A display system as set forth in claim 1, wherein each said semiconductor light-emitting device comprises a first conduction type semiconductor layer, an active layer and a second conduction type semiconductor layer sequentially laminated, said upper end portion electrode is formed at said second conduction type semiconductor layer, and said upper end portion electrode and said conductor film are formed of the same kind of metal.

12. A display system as set forth in claim 1, wherein each said semiconductor light-emitting device comprises a first conduction type semiconductor layer, an active layer and a second conduction type semiconductor layer sequentially laminated, said insulation layer is thinned, and said conductor film is formed on a surface formed by said second conduction type semiconductor layer exposed by said thinning said insulation layer, whereby said upper end portion electrode and said conductor film are formed as one body with each other.

13. A display system as set forth in claim 1, wherein each said semiconductor light-emitting device comprises a first conduction type semiconductor layer, an active layer and a second conduction type semiconductor layer sequentially laminated, said upper end portion electrode is formed on said second conduction type semiconductor layer with a contact metal layer of a predetermined thickness therebetween, and said upper end portion electrode and said conductor film are formed of the same kind of metal.

14. A display system as set forth in claim 1, wherein each said semiconductor light-emitting device comprises a first conduction type semiconductor layer, an active layer and a second conduction type semiconductor layer sequentially laminated, a contact metal layer of a predetermined thickness is formed on said second conduction type semiconductor layer, said insulation layer is thinned, and said conductor film is formed on a surface formed by said contact metal layer exposed by said thinning said insulation layer, whereby said upper end portion electrode and said conductor film are formed as one body with each other.

15. A display system comprising:
at least one semiconductor light-emitting devices embedded in an insulation layer, each of said at least one semiconductor light-emitting devices having
- a lower end surface located in said insulation layer and disposed on a substrate,
- an exposed upper end portion, wherein a planar surface of the insulation layer is coplanar with the exposed upper end portion;
- a light-emitting region provided between said lower end surface and said upper end portion; and a conductor film provided on an upper surface of said insulation layer, said conductor film further being in contact with an upper end portion electrode on said exposed upper end portions of said semiconductor light-emitting devices;

wherein said light-emitting region is at a slant angle relative to said lower end surface.

* * * * *